(12) United States Patent
Shih et al.

(10) Patent No.: US 11,940,738 B2
(45) Date of Patent: Mar. 26, 2024

(54) DROPLET SPLASH CONTROL FOR EXTREME ULTRA VIOLET PHOTOLITHOGRAPHY

(71) Applicant: Taiwan Semiconductor Manufacturing Co., Ltd., Hsinchu (TW)

(72) Inventors: Po-Ming Shih, Hsinchu (TW); Chi-Hung Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 346 days.

(21) Appl. No.: 16/902,085

(22) Filed: Jun. 15, 2020

(65) Prior Publication Data

US 2021/0389675 A1    Dec. 16, 2021

(51) Int. Cl.
*G03F 7/00*    (2006.01)
(52) U.S. Cl.
CPC .......... *G03F 7/705* (2013.01); *G03F 7/70033* (2013.01); *G03F 7/70191* (2013.01)
(58) Field of Classification Search
CPC .. G03F 7/70033; G03F 7/70191; G03F 7/705; G03F 7/70175; G03F 7/70916; H05G 2/00
See application file for complete search history.

(56) References Cited

U.S. PATENT DOCUMENTS

| | | | |
|---|---|---|---|
| 10,527,926 B1 * | 1/2020 | Yang | G03F 1/22 |
| 2012/0085922 A1 * | 4/2012 | Yabu | H05G 2/006 250/432 R |
| 2013/0186567 A1 * | 7/2013 | Yanagida | H05G 2/006 156/345.24 |
| 2013/0228709 A1 * | 9/2013 | Umeda | H05G 2/008 250/493.1 |
| 2014/0061512 A1 * | 3/2014 | Umeda | H05G 2/006 250/504 R |
| 2014/0209819 A1 * | 7/2014 | Umeda | H05G 2/006 222/190 |
| 2015/0002830 A1 * | 1/2015 | Schimmel | G03F 7/70033 355/67 |
| 2016/0227638 A1 * | 8/2016 | Hori | H05G 2/008 |
| 2016/0234920 A1 * | 8/2016 | Suzuki | H05G 2/003 |
| 2016/0278195 A1 * | 9/2016 | Kim | H01S 3/2232 |
| 2016/0366756 A1 | 12/2016 | Wu et al. | |
| 2017/0231075 A1 * | 8/2017 | Umeda | H05G 2/006 |
| 2018/0314145 A1 | 11/2018 | Chang et al. | |

FOREIGN PATENT DOCUMENTS

| | | |
|---|---|---|
| CN | 101160173 A | 4/2008 |
| CN | 103765998 A | 4/2014 |
| CN | 111123655 A | 5/2020 |

* cited by examiner

*Primary Examiner* — Deoram Persaud
(74) *Attorney, Agent, or Firm* — Seed IP Law Group LLP

(57) ABSTRACT

A photolithography system utilizes tin droplets to generate extreme ultraviolet radiation for photolithography. The photolithography system irradiates the droplets with a laser. The droplets become energized and emit extreme ultraviolet radiation. A collector reflects the extreme ultraviolet radiation toward a photolithography target. The photolithography system reduces splashback of the tin droplets onto the receiver by generating a net electric charge within the droplets using a charge electrode and decelerating the droplets by applying an electric field with a counter electrode.

20 Claims, 5 Drawing Sheets

DROPLET SPLASH CONTROL FOR EXTREME ULTRA VIOLET PHOTOLITHOGRAPHY

BACKGROUND

Technical Field

The present disclosure relates to the field of photolithography. The present disclosure relates more particularly to extreme ultraviolet photolithography.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features on an integrated circuit die are produced, in part, with the aid of photolithography. Traditional photolithography techniques include generating a mask outlining the shape of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet light is used to produce particularly small features due to the relatively short wavelength of extreme ultraviolet light. For example, extreme ultraviolet light is typically produced by irradiating droplets of selected materials with a laser beam. The energy from the laser causes the droplets to enter a plasma state. In the plasma state, the droplets emit extreme ultraviolet light. The extreme ultraviolet light travels toward a collector with an elliptical or parabolic surface. The collector reflects the extreme ultraviolet light onto the photolithography target.

DETAILED DESCRIPTION

Figure 1:
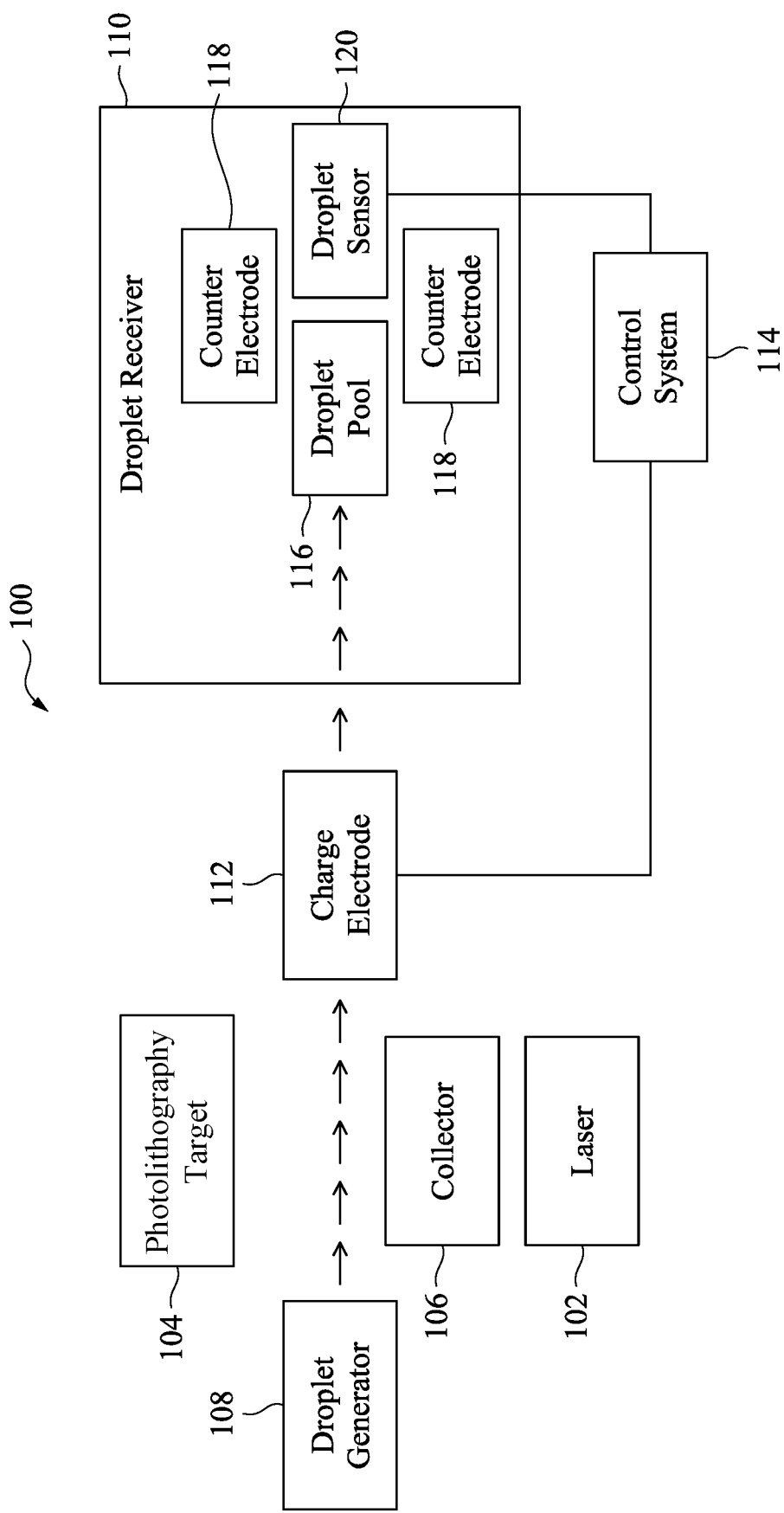
FIG. 1 is a block diagram of a photolithography system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a block diagram of a photolithography system 100 in accordance with one embodiment. The photolithography system 100 includes a laser 102, a photolithography target 104, a collector 106, a droplet generator 108, a droplet receiver 110, a charge electrode 112, and a control system 114. The droplet receiver 110 includes a droplet pool 116, a counter electrode 118, and a droplet sensor 120. The components of the photolithography system 100 cooperate to reduce splashback from droplets onto the collector 106.

The droplet generator 108 generates and outputs a stream of droplets. The droplets can include, in one example, liquid (melted) tin. Other materials can be used for the droplets without departing from the scope of the present disclosure. The droplets move at a high rate of speed toward the droplet receiver 110. The photolithography system 100 utilizes the droplets to generate extreme ultraviolet light for photolithography processes. Extreme ultraviolet light typically corresponds to light with wavelengths between 5 nm and 125 nm.

The laser 102 outputs a laser beam. The laser beam is focused on a point through which the droplets pass on their way from the droplet generator 108 to the droplet receiver 110. In particular, the laser 102 outputs laser pulses. Each laser pulse is received by a droplet. When the droplet receives the laser pulse, the energy from the laser pulse generates a high-energy plasma from the droplet. The high-energy plasma outputs extreme ultraviolet radiation.

In one embodiment, the radiation output by the plasma scatters randomly in many directions. The photolithography system 100 utilizes the collector 106 to collect the scattered extreme ultraviolet radiation from the plasma droplets and reflect the extreme ultraviolet radiation toward a photolithography target 104, or toward equipment that will guide the extreme ultraviolet radiation to the photolithography target 104.

In one embodiment, the collector 106 includes an aperture. The laser pulses from the laser 102 pass through the aperture toward the stream of droplets. This enables the collector 106 to be positioned between the laser 102 and the photolithography target 104.

After the droplets have been irradiated by the laser 102, the droplets continue with a trajectory toward the droplet receiver 110. The droplet receiver 110 receives the droplets in a droplet pool 116. The droplet pool 116 collects the droplets. The droplets can be drained from the droplet pool 116 and reused or disposed of.

It is possible that some splashback from the droplets may fall upon the collector 106. This is because the droplets travel with high velocity. The high velocity of the droplets can result in splashing. This splashing, or splashback, can travel back toward the collector 106.

Droplet splashback on the collector 106 can have adverse effects on the photolithography system 100. For example, the splashback can result in an uneven surface of the collector 106. If the surface of the collector 106 is bumpy or otherwise uneven, the collector 106 may not reflect the extreme ultraviolet radiation toward the photolithography target 104. It is also possible that the accumulation of splashback on the reflector 106 will cause the collector 106 to become substantially nonreflective. In either of these cases, the photolithography system 100 may not effectively irradiate the photolithography target 104 with extreme ultraviolet radiation.

The photolithography system 100 utilizes the charge electrode 112 and the counter electrode 118 to reduce splashback on the collector 106. Voltages are applied to the charge electrode 112 and the counter electrode 118. As will be described in more detail below, the voltages applied to the charge electrode 112 and the counter electrode 118 can assist in reducing splashback of the droplets onto the collector 106.

In one embodiment, a voltage is applied to the charge electrode 112. The charge electrode 112 is positioned so that droplets output by the droplet generator 108 pass adjacent to the charge electrode 112 as they travel toward the droplet receiver 110. Because a high voltage is applied to the charge electrode 112, as the droplets pass adjacent to the charge electrode 112, free charges in the droplets are attracted to the charge electrode 112. The result is that the droplets gain a net electric charge. In particular, the droplets have a net electric charge with a polarity opposite to the polarity of the voltage applied to the charge electrode 112.

In one embodiment, imparting a charge to the droplets is facilitated by the fact that the droplets are in a plasma state. In the plasma state, valence electrons are freed from their atoms, enabling the electrons to move freely. The individual conductivity of charged particles in the plasma state enables the free charges to be drawn to the charge electrode 112.

In one embodiment, the charge electrode 112 has a positive voltage. Free electrons in the droplets are drawn to the charge electrode 112. The result is that the droplets have a net positive charge due to the smaller number of electrons than protons in the droplets. Thus, the charge electrode 112 generates positively charged droplets, in one example.

In one embodiment, the counter electrode 118 carries a voltage or a net charge with a same polarity as the voltage or net charge on the charge electrode 112. Accordingly, as the charged droplets approach the counter electrode 118, the charged droplets experience a repulsive electromagnetic force. The repulsive electromagnetic force reduces the velocity of the droplets. Because the velocity of the droplets is reduced, the droplets produce little or no splashback.

In one embodiment, a higher voltage is applied to the counter electrode 118 than to the charge electrode 112. The reason for this is that after the charge electrode 112 has charged the droplets, the droplets may be accelerated by the electrostatic force between the charge electrode 112 and the charged droplets as the charged droplets move beyond the charge electrode 112 toward the droplet receiver 110. Accordingly, the counter electrode 118 may have a voltage or a net charge higher than the voltage or net charge on the charge electrode 112. In this way, the counter electrode 118 can decelerate the charged droplets to a greater degree than the charge electrode 112 can accelerate the charged droplets.

In one embodiment, the photolithography system 100 includes a droplet sensor 120. The droplet sensor 120 senses the speed of the droplets as they are received into the droplet pool 116. This measurement of the speed of the droplets can be utilized to calibrate or fine-tune the voltages applied to the charge electrode 112 and the counter electrode 118. The droplet sensor 120 generates sensor signals indicative of the speed of the droplets as they pass through the droplet receiver 110.

The control system 114 is coupled to the droplet sensor 120. The control system 114 receives the sensor signals from the droplet sensor 120. The control system 114 processes the sensor signals. The control system 114 can determine whether the droplets are sufficiently decelerated based on the sensor signals from the droplet sensor 120.

The control system 114 is coupled to the charge electrode 112 and the counter electrode 118. The control system 114 can control voltages applied to the charge electrode 112 and to the counter electrode 118. In particular, the control system 114 can control the voltages applied to the charge electrode 112 and the counter electrode 118 based on the sensor signals received from the droplet sensor 120. If the sensor signals indicate that the speed of the droplets is still too high as the droplets are received into the droplet pool 116, then the control system 114 can adjust the voltages applied to the charge electrode 112 and/or to the counter electrode 118.

The primary force that slows the droplets is the repulsive electromagnetic force between the counter electrode 118 and the droplets. The electromagnetic force results from the voltage applied to the counter electrode 118 and the net charge carried by the droplets. The electromagnetic force is repulsive because the net charge carried by the droplets is the same polarity as the voltage applied to the counter electrode 118. As the charged droplets approach the counter electrode 118, the repulsive force slows down the droplets.

The primary factors that determine the strength of the electromagnetic force are the magnitude of the net charge carried by the droplets and the magnitude of the voltage applied to the counter electrode 118. Increasing either of these quantities results in a greater repulsive electromagnetic force. The net charge carried by the droplets is determined, primarily, by the magnitude of the voltage applied to the charge electrode 112. A higher voltage applied to the charge electrode 112 will result in a higher net charge on the droplets. Accordingly, increasing either of the voltages applied to the charge electrode 112 and the counter electrode 118 will result in greater deceleration of the droplets. Thus, the control system 114 can adjust the speed of the droplets by increasing a voltage on either or both of the charge electrode 112 and the counter electrode 118.

In one embodiment, the counter electrode 118 includes multiple counter electrodes 118 positioned in the droplet receiver 110. The multiple counter electrodes are arranged along a path of travel of the droplets through the droplet receiver. The counter electrodes 118 closer to the charging electrode carry a lower voltage than the counter electrodes further from the charge electrode 112, though all counter electrodes 118 carry the same polarity of voltage as the charge electrode 112. The increasing voltage of the counter electrodes 118 ensures that the droplets will continue to decelerate as they travel through the droplet receiver 110.

In one embodiment, the droplet receiver 110 has a conductive shell or body. The conductive shell of the droplet receiver can function as the counter electrode 118. A voltage can be applied to the conductive shell to decelerate the droplets as they pass through the droplet receiver. The conductive shell can carry a charge gradient such that the magnitude of a charge or voltage carried by the conductive shell increases with increasing distance from the charge electrode 112. Accordingly, the droplet receiver 110 can include a dynamically charged conductive shell that acts as the counter electrode.

In one embodiment, the control system 114 adjusts the speed of the droplets by increasing a voltage of the counter electrode 118 relative to the charge electrode 112. After the droplets pass through the charge electrode 112, the droplets will experience an acceleration due to the repulsive electromagnetic force between the charge electrode 112 and the now charged droplets. Accordingly, an effective way to decrease the speed of the droplets is to increase the voltage applied to the counter electrode 118 relative to the charge electrode 112. This will ensure that the deceleration experienced by the droplets as they approach counter electrode is greater than the acceleration experienced by the droplets as they travel away from the charge electrode 112. Nevertheless, the control system 114 can reduce the speed of the droplets by adjusting the voltages applied to either or both of the charge electrode 112 and the counter electrode 118.

In one example, the control system 114 can increase the voltage applied to the charge electrode 112 in order to impart a greater net charge to the droplets. The control system 114 can apply a corresponding voltage increase to the counter electrode 118. In some embodiments, the control system can apply a greater increase in voltage to the counter electrode 118 than to the charge electrode 112. In some embodiments, the control system 114 can apply the same voltage increase to both the charge electrode 112 and the counter electrode 118. In some embodiments, the control system 114 can adjust the voltage of only one of the counter electrode 118 and the charge electrode 112. In some embodiments, the control system 114 can increase the voltage on one of the charge electrode 112 and the counter electrode 118 and decrease the voltage on the other of the charge electrode 112 and the counter electrode 118.

Another possible way to reduce splashback is to increase the temperature of the droplets. The droplets may effectively become stickier with increasing temperature. The sticker droplets may not splashback as much upon impacting a back area of the droplet receiver 110.

As used herein, the voltage applied to the charge electrode is termed a first voltage. The voltage applied to the counter electrode 118 is termed a second voltage. The first and second voltages may or may not be a same value.

In one embodiment, the control system 114 includes or is coupled to a power source. The power source supplies voltages to the charge electrode 112 and to the counter electrode 118. The control system 114 can control the voltages supplied by the power source to the charge electrode 112 and the counter electrode 118.

In one embodiment, the control system 114 is coupled to the droplet generator 108. The control system 114 can apply a voltage to the droplet generator 108 or to a portion of the droplet generator 108. For example, in one embodiment, the control system 114 can apply a ground voltage to the droplet generator 108 in order to generate an initial voltage drop between the droplets and the charge electrode 112.

The control system 114, the droplet sensor 120, the charge electrode 112, and the counter electrode 118, act as a feedback loop. The feedback loop controls the speed of the droplets. More particularly, the feedback loop measures and adjusts the speed of the droplets to reduce or eliminate splashback of the droplets onto the collector 106.

In one embodiment, the control system 114 utilizes machine learning to accurately adjust the speed of the droplets. Accordingly, the control system 114 can include a machine learning model that can be trained to adjust the voltages applied to the charge electrode 112 and the counter electrode 118 responsive to the sensor signals provided by the droplet sensor 120 in order to accurately achieve a desired speed for the droplets.

In one embodiment, the machine learning model includes a decision tree model. The decision tree model receives input data regarding the droplets, the charge electrode, and the counter electrode. In one example, the input data can include the mass of the droplets, the temperature of the droplets, the current value of the speed of the droplets, a previous value of the speed of the droplets, a current value of the voltage on the charge electrode 112, a current value of the voltage on the counter electrode 118, a previous value of the voltage on the charge electrode 112, and a previous value of the voltage on the counter electrode 118. The previous value of the speed of the droplets can correspond to the speed of the droplets prior to a most recent voltage adjustment made by the control system 114. The previous value of the voltage on the charge electrode 112 can correspond to the value of the charge on the charge electrode 112 prior to a most recent voltage adjustment made by the control system 114. The previous value of the voltage on the counter electrode 118 can correspond to the value of the charge on the counter electrode prior to a most recent voltage adjustment made by the control system 114. The input data can be provided to the decision tree model as a vector or series of vectors having data values representative of the values described above.

In one embodiment, the decision tree model includes a plurality of decision nodes. Each decision node includes a decision rule. The decision rule at a decision node applies to one or more of the input values. For example, one or more decision nodes may apply a rule regarding the current speed of the droplets. One or more decision nodes may apply a rule regarding the previous speed of the droplets, and so forth for the various types of the input data. In one example, a first decision node applies a rule that if the current speed is within a selected range then follow a first path to a next decision node, if not, follow a second path to a next decision node. Next nodes may apply rules regarding the previous speed of the droplets or the current mass of the droplets, for example.

Each decision node can include two or more decision paths that each lead to another decision node. A final layer of decision nodes determines the action, if any, to be taken by the control system. Accordingly, the values of the various input data fields determine the path that will be traveled through the decision tree until the input data arrives at one of a plurality of possible final decisions or classifications. The various possible final decisions or classifications can include increasing the voltage on the charge electrode 112, increasing the voltage on the counter electrode 118, decreasing the voltage on the charge electrode 112, decreasing the voltage on the counter electrode 118, increasing the voltage on both the charge electrode 112 and the counter electrode 118, decreasing the voltage on both the charge electrode 112 and the counter electrode 118, increasing the voltage on the charge electrode 112 and decreasing the voltage on the counter electrode 118, decreasing the voltage on the charge electrode 112 and increasing the voltage on the counter electrode 118, increasing the temperature of the droplets, decreasing the temperature of the droplets, and making no adjustment at all. The final decision or classification determines the action that will be taken by the control system 114. When the final decision or classification includes an adjustment to the voltage on one or both of the charge electrode 112 and the counter electrode 118, the final decision or classification corresponds to voltage adjustment data. The control system 114 adjusts the voltages in accordance with the voltage adjustment data.

In one embodiment, the decision tree model is trained with an unsupervised machine learning process. During the unsupervised machine learning process the decision tree model is given a directive to adjust parameters of the photolithography system 100 in order to adjust or maintain the speed of the droplets within a selected speed range or below a selected speed threshold. During the unsupervised machine learning process, the machine learning model sets up a number of decision nodes and decision rules. Droplets are passed through the charge electrode 112 into the droplet receiver 110. The speed of the droplets is measured, and the various other input data are provided to the decision tree. The various voltages are adjusted in accordance with the final decision and the process repeats. Throughout the machine learning process, the decision nodes, pathways, decision rules and final decisions are adjusted in iterations until the control system 114 is able to reliably achieve and maintain the selected speed for the droplets. In this way, the decision tree learns an algorithm that can maintain the speed of the droplets in the desired range.

There is a potentially very large number of combinations of decision nodes and rules, i.e., algorithms, that can achieve the desired droplet speed results. The final selected algorithm is determined by the machine learning process and the initial parameters provided to the decision tree model by experts. The initial parameters can include initial decision nodes and decision rules. In an alternative embodiment, the machine learning process can include a supervised machine learning process utilizing training sets from past measurements of droplet speed, electrode voltages, and adjustments.

In one embodiment, the machine learning model includes a neural network based algorithm. The neural network based algorithm can include any one of a plurality of neural network including, but not limited to, recurrent neural networks, convolutional neural networks, deep convolutional neural networks, and feed forward neural networks. The input to the neural network can include the same types of input data described above in relation to the decision tree network. The neural network includes a series of neural layers with weighted neurons that collectively determine one of a plurality of possible actions to be taken by the control system 114 based on the input data. The machine learning process can include supervised machine learning processes, deep learning processes, or unsupervised machine learning processes. Other types of machine learning models than those described above can be utilized for controlling the speed of droplets without departing from the scope of the present disclosure.

In one embodiment, the control system 114 does not utilize a machine learning model. Instead, the control system 114 can execute a simple algorithm that determines what adjustments should be made based on the types of input data described above in relation to the machine learning models. The algorithm can be defined by human experts and programmed into the control system 114. Those of skill in the art will recognize, in light of the present disclosure, that many types of algorithms can be utilized to achieve a selected droplet speed, without departing from the scope of the present disclosure.

Figure 2:
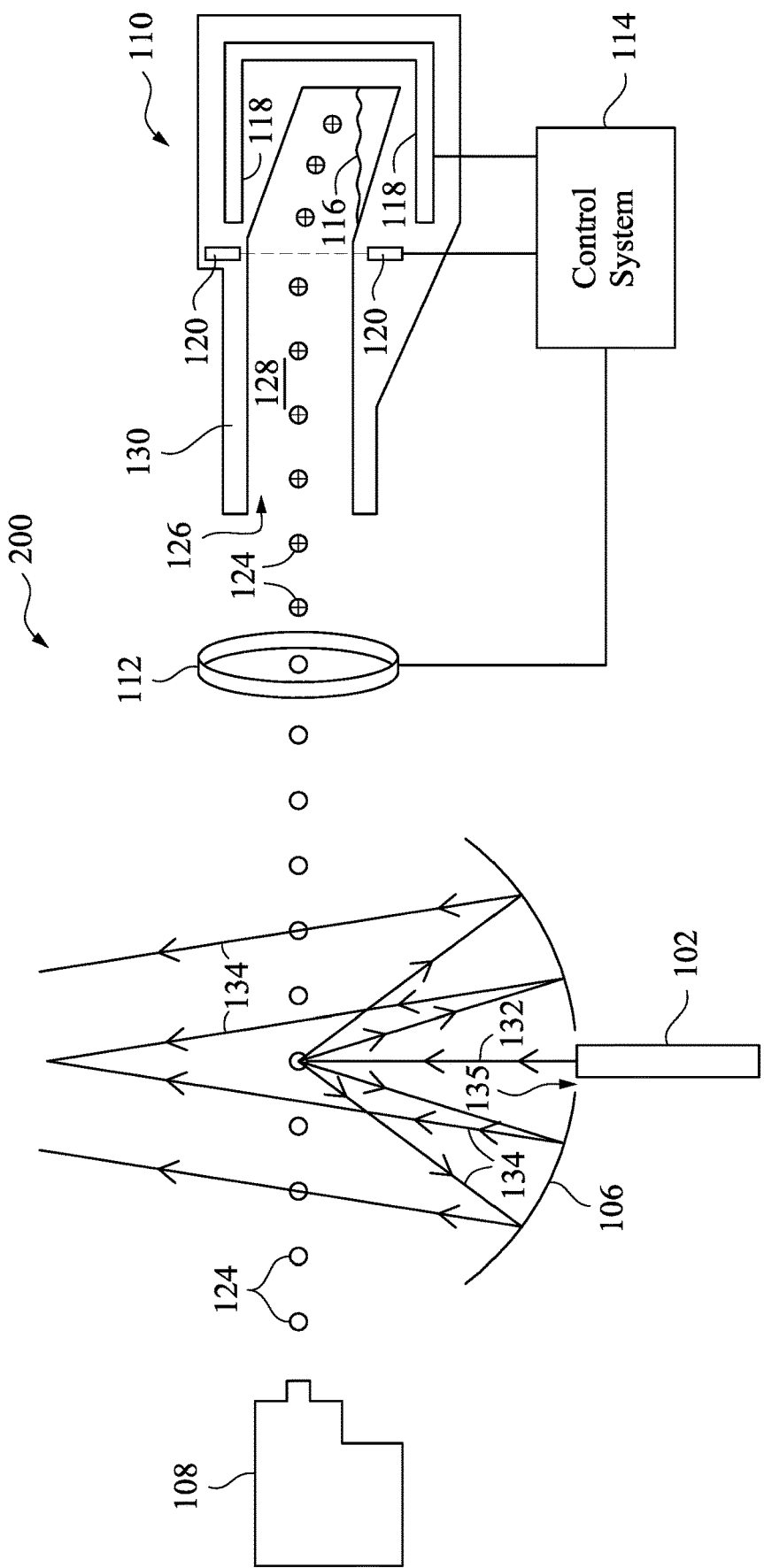
FIG. 2 is a block diagram of a photolithography system, according to one embodiment.

FIG. 2 is an illustration of a photolithography system 200, according to an embodiment. The photolithography system 100 includes a laser 102, a photolithography target 104, a collector 106, a droplet generator 108, a droplet receiver 110, a charge electrode 112, and a control system 114.

The droplet generator 108 generates and outputs a stream of droplets 124. The droplets can include, as described previously, tin. The droplets 124 move at a high rate of speed toward the droplet receiver 110.

The laser 102 is positioned behind a collector 106. The laser 102 outputs pulses of laser light 132. The pulses of laser light 132 are focused on a point through which the droplets pass on their way from the droplet generator 108 to the droplet receiver 110. Each pulse of laser light 132 is received by a droplet 124. When the droplet 124 receives the pulse of laser light 132, the energy from the laser pulse generates a high-energy plasma from the droplet 124. The high-energy plasma outputs extreme ultraviolet radiation.

In one embodiment, the laser 102 is a carbon dioxide (CO2) laser. The CO2 laser emits radiation or laser light 132 with a wavelength centered around 9.4 µm or 10.6 µm. The laser 102 can include lasers other than carbon dioxide lasers and can output radiation with other wavelengths than those described above without departing from the scope of the present disclosure.

In one embodiment the droplet generator 108 generates between and 60,000 droplets per second. The droplets 124 have an initial velocity of between 70 m/s and 90 m/s. The droplets have a diameter between 10 μm and 200 μm. The droplet generator 108 can generate different numbers of droplets per second than described above without departing from the scope of the present disclosure. The droplet generator 108 can also generate droplets having different initial velocities and diameters than those described above without departing from the scope of the present disclosure.

In one embodiment, the laser 102 irradiates each droplet 124 with two pulses. A first pulse causes the droplet 124 to flatten into a disk like shape. The second pulse causes the droplet 124 to form a high temperature plasma. The second pulse is significantly more powerful than the first pulse. The laser 102 and the droplet generator 108 are calibrated so that the laser 102 emits pairs of pulses such that each droplet 124 is irradiated with a pair of pulses. For example, if the droplet generator 108 outputs 50,000 droplets per second, the laser 102 will output pairs of pulses per second. The laser 102 can irradiate droplets 124 in a manner other than described above without departing from the scope of the present disclosure. For example, the laser 102 may irradiate each droplet 124 with a single pulse or with more pulses than two.

In one embodiment, the droplets 124 are tin. When the tin droplets 124 are converted to a plasma, the tin droplets 124 output extreme ultraviolet radiation 134 with a wavelength centered between 10 nm and 15 nm. More particularly, in one embodiment the tin plasma shines with a characteristic wavelength of 13.5 nm. These wavelengths correspond to extreme ultraviolet radiation. Materials other than tin can be used for the droplets 124 without departing from the scope of the present disclosure. Such other materials may generate extreme ultraviolet radiation with wavelengths other than those described above without departing from the scope of the present disclosure.

In one embodiment, the radiation 134 output by the droplets scatters randomly in many directions. The photolithography system 100 utilizes the collector 106 to collect the scattered extreme ultraviolet radiation 134 from the plasma and output the extreme ultraviolet radiation toward a photolithography target 104.

In one embodiment, the collector 106 is a parabolic or elliptical mirror. The scattered radiation 134 is collected and reflected by the parabolic or elliptical mirror with a trajectory toward a photolithography target 104.

In one embodiment, the collector 106 includes an aperture 135. The pulses of laser light 132 pass from the laser 102 through the aperture 135 toward the stream of droplets 124. This enables the collector 106 to be positioned between the laser 102 and the photolithography target 104.

After the droplets 124 have been irradiated by the laser 102, the droplets 124 continue with a trajectory toward the droplet receiver 110. In particular, the droplets enter an opening 126 in the droplet receiver 110 and travel through an interior passage 128 toward a droplet pool 116 at a back end of the inner passage 128. The droplet pool 116 collects the droplets 124. The droplet receiver 110 can further include a drain port (not shown) that drains the droplet pool 116. The droplets 124 can be reused or disposed of.

In order to reduce or eliminate splashback from the droplets 124, the photolithography system 100 includes a ring shaped, annular, or toroidal charge electrode 112. The charge electrode 112 is positioned so that the droplets 124 pass through a center of the ring shaped charge electrode 112. The charge electrode 112 is positioned downstream from the location at which the droplets 124 are irradiated, and upstream from the droplet receiver 110.

The charge electrode 112 is coupled to the control system 114. The control system 114 applies, or causes to be applied, a voltage to the charge electrode 112. In one embodiment, the voltage applied to the charge electrode is between 100 V and 40,000 V, though other voltages can be applied to the charge electrode 112 without departing from the scope of the present disclosure. The voltage can be selected to be sufficient to draw free electrons from the droplets 124 to the charge electrode 112. Higher voltages on the charge electrode 112 will draw larger numbers of electrons from each droplet 124. The larger the number of electrons drawn from a droplet 124, the greater the net positive charge on the droplet. The greater the net positive charge, the greater the reduction in speed that can be achieved via the counter electrode 118. The charge electrode 112 can also carry a net positive charge such that the electrode 112 generates an electric field in the vicinity of the charge electrode 112.

The droplet receiver 110 includes an outer casing 130. The outer casing 130 encloses the interior passage 128. The counter electrode 118 is positioned in the casing 130 adjacent to a backend of the interior passageway 128. The counter electrode 118 includes a cup shape such that the counter electrode 118 surrounds a backend of the interior passageway 128. The counter electrode 118 can include other shapes and positions without departing from the scope of the present disclosure.

The counter electrode 118 is coupled to the control system 114. The control system 114 applies, or causes to be applied, a voltage to the counter electrode 118. In one embodiment, the counter electrode 118 carries a voltage or a net charge with a same polarity as the voltage or net charge on the charge electrode 112. Accordingly, as the charged droplets approach the counter electrode 118, the charged droplets experience a repulsive electromagnetic force. The repulsive electromagnetic force reduces the velocity of the droplets. Because the velocity of the droplets is reduced, the droplets produce little or no splashback.

In one embodiment, a higher voltage is applied to the counter electrode 118 than to the charge electrode 112. The reason for this is that after the charge electrode 112 has charged the droplets, the droplets may be accelerated by the electromagnetic force between the charge electrode 112 and the charged droplets as the charged droplets move beyond the charge electrode 112 toward the droplet receiver 110. Accordingly, the counter electrode 118 may have a voltage or net charge that is higher than the voltage or net charge on the charge electrode 112. In this way, the counter electrode 118 can decelerate the charged droplets to a greater degree than the charge electrode 112 can accelerate the charged droplets.

In one embodiment, the voltage applied to the counter electrode 118 is between 1000 V and 60,000 V, though other voltages can be applied to the charge electrode 112 without departing from the scope of the present disclosure.

The droplet sensor 120 is positioned within or adjacent to a backend of the interior passage 128. In the example of FIG. 2, the droplet sensor 120 includes a laser sensor that senses the velocity or speed of the droplets 124 as the droplets approach the droplet pool 116. The laser sensor can include laser and a sensor receiver. The laser outputs a laser beam toward the sensor receiver. As a droplet passes through the laser beam, the laser beam is interrupted such that the sensor receiver does not receive the laser beam for a duration of time corresponding to the time required for the droplet to entirely pass through the laser beam. If the size of the droplet 124 is known or estimated, then the speed or velocity of the droplet 124 can be calculated or estimated based on the duration of the interruption.

The sensor receiver can pass sensor signals to the control system 114 indicative of the speed or velocity of the droplets 124. The sensor signals can include digital or analog signals. The sensor signals can include data explicitly indicating the speed of the droplets. Alternatively, the sensor signals can include analog waveforms indicative of the interruptions, and thereby indicative of the speed. Other schemes for sensor signals can be used without departing from the scope of the present disclosure. Other types of droplet sensors 120 can be used without departing from the scope of the present disclosure.

The control system 114 receives the sensor signals from the droplet sensor 120. The control system 114 processes the sensor signals. The control system 114 can determine whether the droplets are sufficiently decelerated based on the sensor signals from the droplet sensor 120.

The control system 114 can include one or more controllers or processors. The control system 114 can include one or more computer memories that can store instructions and data. The controllers or processors can execute the instructions and process the data.

The control system 114 can control the voltages applied to the charge electrode 112 and the counter electrode 118 based on the sensor signals received from the droplet sensor 120. If the sensor signals indicate that the speed of the droplets is too high as the droplets are received into the droplet pool 116, then the control system 114 can adjust the voltages applied to the charge electrode 112 and/or to the counter electrode 118.

In one example, the control system 114 can take steps to reduce the speed of the droplets by increasing the voltages applied to the charge electrode 112 and the counter electrode 118. In one example, the control system 114 can increase the voltage applied to the charge electrode 112 in order to impart a greater net charge to the droplets. The control system 114 can apply a corresponding voltage increase to the counter electrode 118. In some circumstances, the control system can apply a greater increase in voltage to the counter electrode 118 than to the charge electrode 112. In some circumstances, the control system 114 can apply the same voltage increase to both the charge electrode 112 and the counter electrode 118. In some circumstances, the control system 114 can adjust the voltage of only one of the counter electrode 118 and the charge electrode 112. In some circumstances, the control system 114 can increase the voltage on one of the charge electrode 112 or the counter electrode 118. The control system 114 can decrease the voltage on the other of the charge electrode 112 and the counter electrode 118. The control system 114 of FIG. 2 can utilize the same types of actions as those described above in relation to FIG. 1.

In one embodiment, the control system 114 includes or is coupled to a power source. The power source supplies voltages to the charge electrode 112 and to the counter electrode 118. The control system 114 can control the voltages supplied by the power source to the charge electrode 112 and the counter electrode 118.

In one embodiment, the control system 114 is coupled to the droplet generator 108. The control system 114 can apply a voltage to the droplet generator 108 or to a portion of the droplet generator 108. For example, in one embodiment, the control system 114 can apply a ground voltage to the droplet generator 108 in order to generate an initial voltage drop between the droplets and the charge electrode 112. Alternatively, the control system 114 utilize another ground voltage or reference voltage.

In one embodiment, the control system 114 can utilize machine learning models or other types of algorithms to achieve the desired speed of the droplets including, but not limited to, the machine learning models and algorithms described above in relation to FIG. 1.

Figure 3:
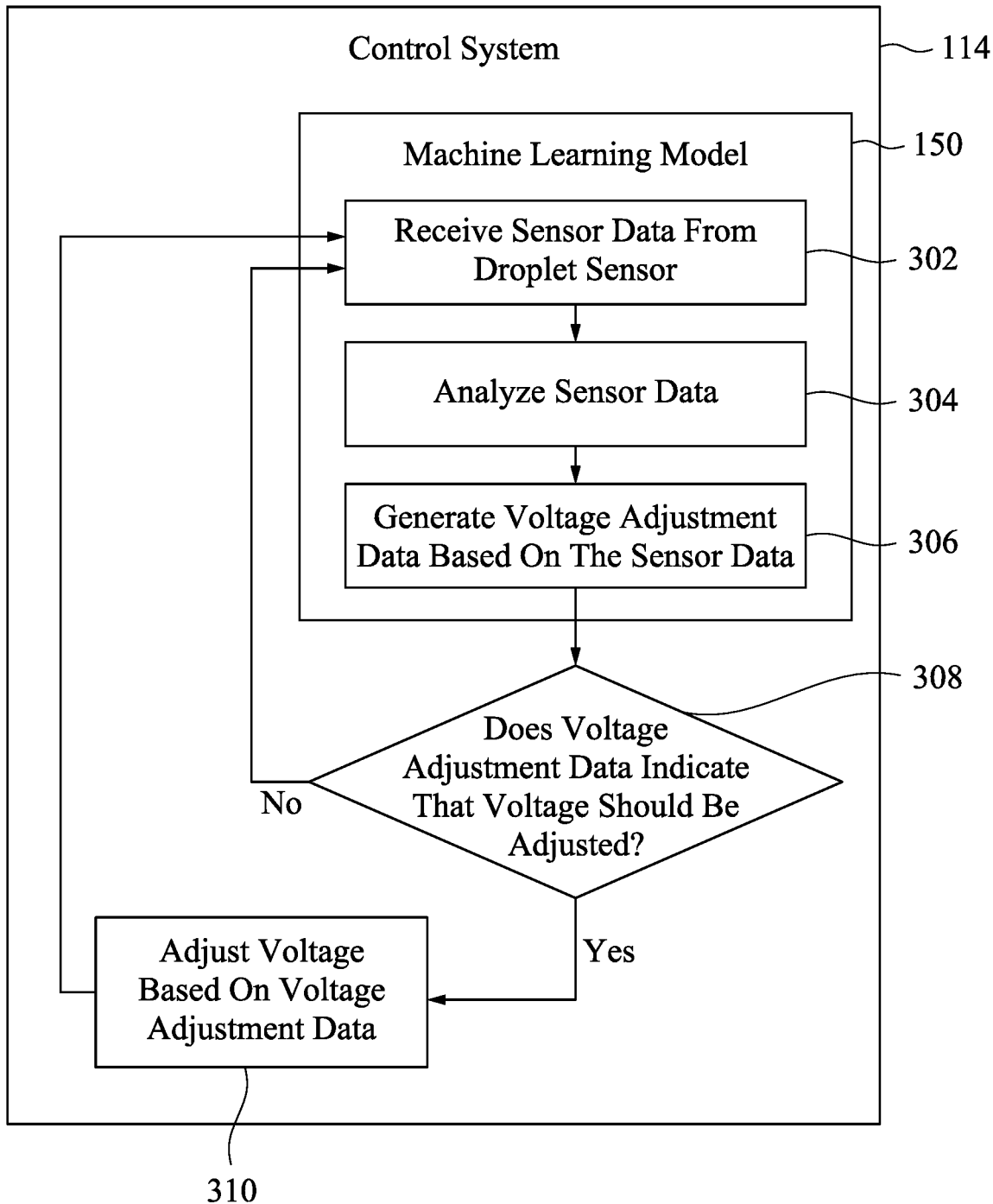
FIG. 3 is a functional flow diagram of a process for reducing splashback in a photolithography system.

FIG. 3 is a functional flow diagram of a process for 300 for controlling splashback of droplets in a photolithography process, according to an embodiment. The process 300 is performed by a control system 114 including a machine learning model 150.

At 302, the machine learning model 150 receives sensor data from a droplet sensor, utilizing any of the components and processes described in relation to FIGS. 1 and 2. The sensor data can include the sensor signals provided by the droplet sensor. Alternatively, the sensor data can include data derived from the sensor signals provided by the droplet sensor. Accordingly, receiving sensor data from the droplet sensor can include receiving sensor data derived from sensor signals received from the droplet sensor.

At block 304, the machine learning model analyzes the sensor data, utilizing any of the components or processes described in relation to FIGS. 1 and 2. The machine learning model 150 can include a model that has been trained with a machine learning process, in the case of a supervised machine learning model. The supervised machine learning process can train the machine learning model to generate voltage adjustment data that will result in a desired speed of the droplets in order to reduce splashback. The supervised machine learning process can train the machine learning model to generate the voltage adjustment data based on the sensor data. Accordingly, the supervised machine learning process can utilize the training set data that includes measured splashback and sensor data. Alternatively, the machine learning model 150 can include an unsupervised machine learning model. Other machine learning models and processes can be utilized for the machine learning model 150 without departing from the scope of the present disclosure. The machine learning model can include, but is not limited to, the types of machine learning models described above in relation to FIG. 1.

At 306, the machine learning model generates voltage adjustment data based on the sensor data. The voltage adjustment data indicates that adjustments should be made to either or both of the voltages applied to a charge electrode and a counter electrode. The voltage adjustment data can also indicate that no adjustment should be made to the voltages.

At 308, if the voltage adjustment data indicates that voltage adjustment should be made, the process proceeds to 310. At 310, the control system 114 adjusts the voltages applied to the charge electrode and/or the counter electrode based on the voltage adjustment data. From 310, the process returns to 302.

At 308, if the voltage adjustment data indicates that the voltages should not be adjusted, the process returns to 302.

By utilizing the machine learning model 150, the control system 114 can adjust the voltages applied to the counter electrode and the charge electrode in iterations. The process repeats itself until the speed of the droplets is in an acceptable range. Thereafter, the process repeats itself to maintain the speed of the droplets in the acceptable range. In this way, the control system 114 can operate to reduce splashback of the droplets onto the collector.

Figure 4:
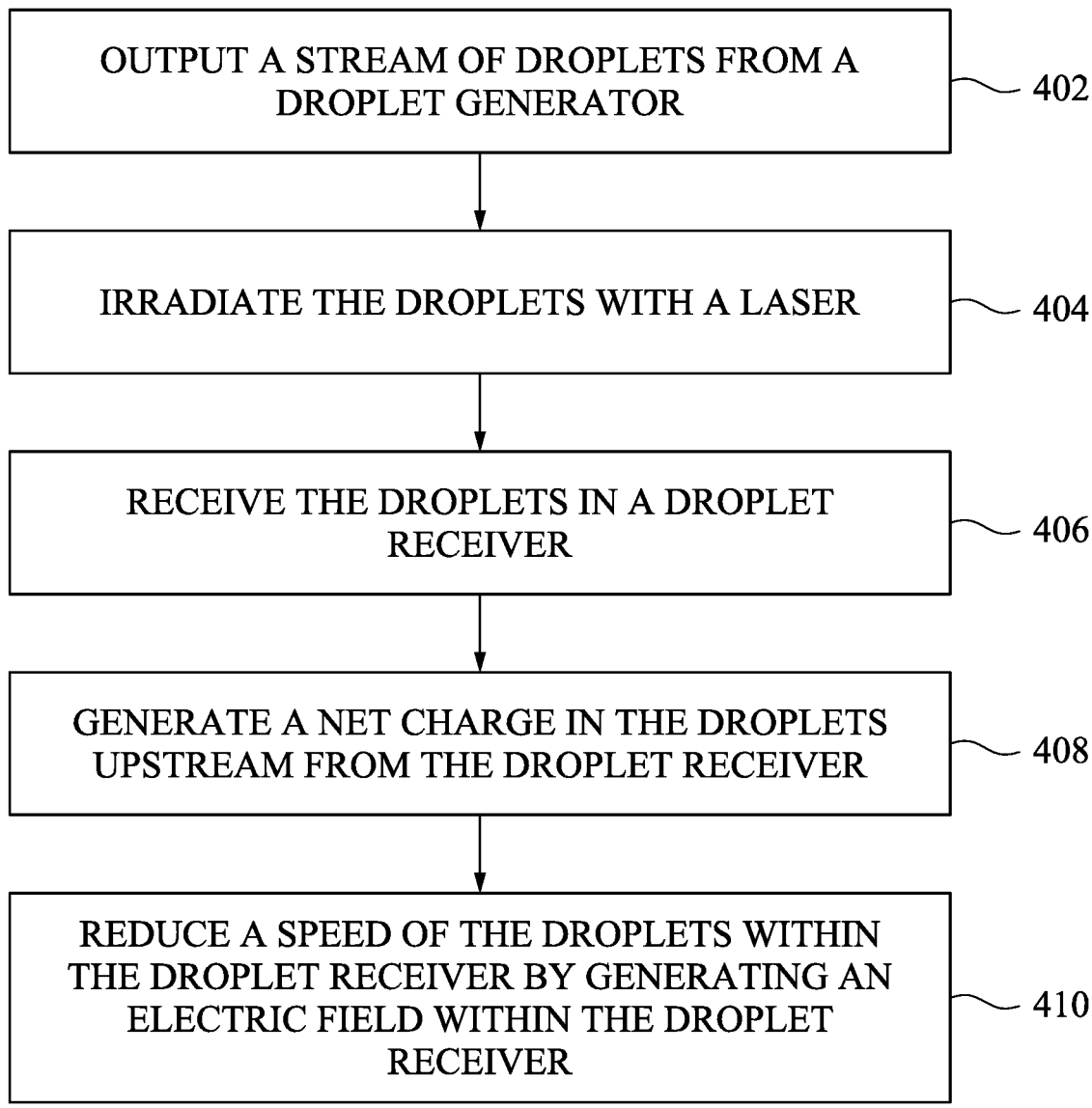
FIG. 4 is a method for reducing splashback in a photolithography process, according to an embodiment.

FIG. 4 is a method 400 for reducing splashback of droplets in a photolithography system, according to an embodiment. At 402, the method 400 includes outputting a stream of droplets from a droplet generator. One example of a droplet generator is the droplet generator 108 of FIG. 1 or FIG. 2. At 404, the method 400 includes irradiating the droplets with a laser. One example of a laser is a laser 102 of FIG. 1 or FIG. 2. At 406, the method 400 includes receiving the droplets in a droplet receiver. One example of a droplet receiver is the droplet receiver 110 of FIG. 1 or FIG. 2. At 408, the method 400 includes generating a net charge in the droplets upstream from the droplet receiver. At 410, the method 400 includes reducing a speed of the droplets within the droplet receiver by generating an electric field within the droplet receiver.

Figure 5:
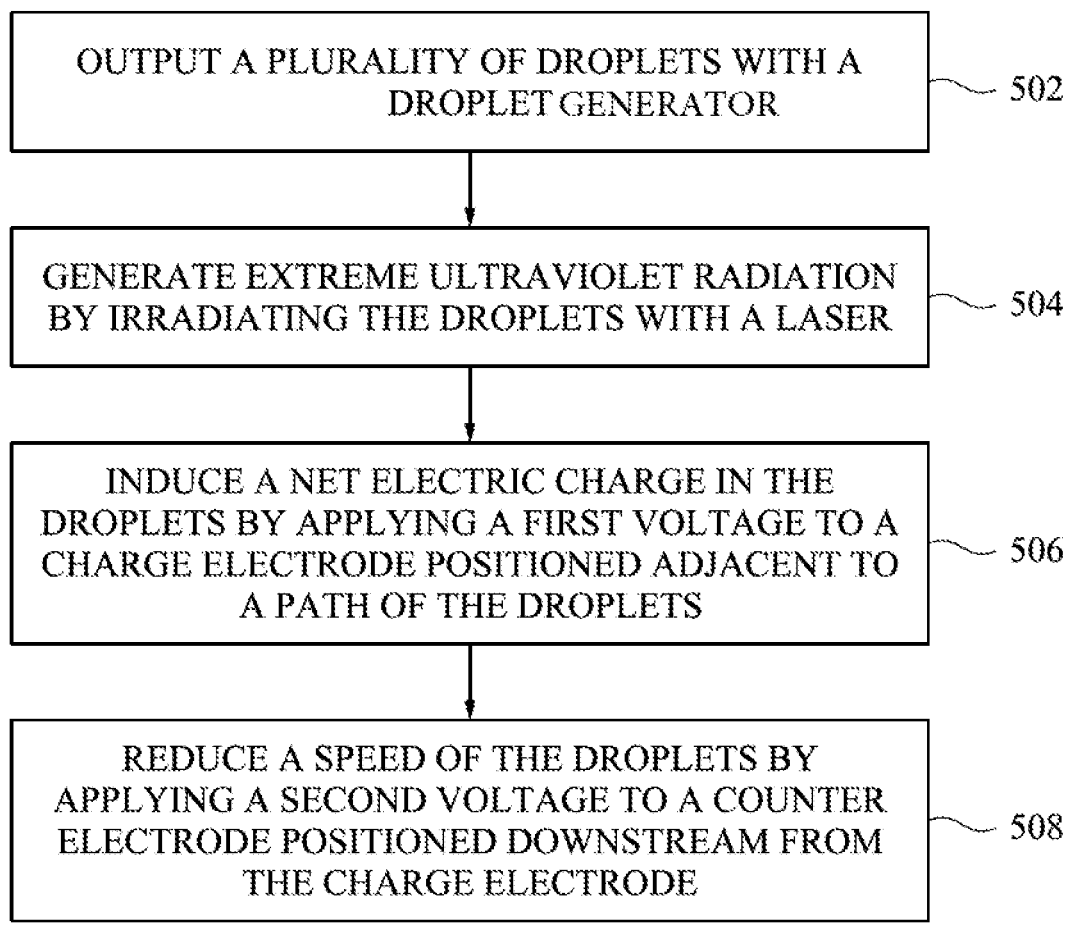
FIG. 5 is a method for reducing splashback in a photolithography process, according to an embodiment.

FIG. 5 is a method 500 for reducing splashback of droplets in a photolithography system, according to an embodiment. At 502, the method 500 includes outputting a plurality of droplets with a droplet generator. One example of a droplet generator is the droplet generator 108 of FIG. 1 or FIG. 2. At 504, the method 500 includes generating extreme ultraviolet radiation by irradiating the droplets with a laser. One example of a laser is the laser 102 of FIG. 1 or FIG. 2. At 506, the method 500 includes inducing a net electric charge in the droplets by applying a first voltage to a charge electrode positioned adjacent to a path of the droplets. One example of the charge electrode is the charge electrode 112 of FIG. 1 or FIG. 2. At 508, the method 500 includes reducing a speed of the droplets by applying a second voltage to a counter electrode positioned downstream from the charge electrode. One example of the counter electrode is the counter electrode 118 of FIG. 1 or FIG. 2.

In one embodiment, a photolithography system includes a droplet generator configured to output a stream of droplets and a droplet receiver positioned to receive the droplets. The system includes a laser configured to irradiate the droplets and a collector configured to receive extreme ultraviolet radiation from the droplets and to reflect the extreme ultraviolet radiation for use in photolithography. The system includes a charge electrode positioned between the droplet generator and the droplet receiver. The system includes a counter electrode positioned downstream from the charge electrode with respect to a direction of travel of the droplets. The system includes a control system configured to apply a first voltage to the charge electrode and a second voltage to the counter electrode. The first voltage is selected to impart a net electric charge to the droplets as the droplets pass adjacent to the charge electrode. The second voltage is selected to decelerate the droplets as the droplets pass adjacent to the counter electrode.

In one embodiment, a method includes outputting a stream of droplets from a droplet generator, irradiating the droplets with a laser, and receiving the droplets in a droplet receiver. The method includes generating a net charge in the droplets upstream from the droplet receiver and reducing a speed of the droplets within the droplet receiver by generating an electric field within the droplet receiver.

In one embodiment, a method includes outputting a plurality of droplets with a droplet generator and generating extreme ultraviolet radiation by irradiating the droplets with a laser. The method includes inducing a net electric charge in the droplets by applying a first voltage to a charge electrode positioned adjacent to a path of the droplets and reducing a speed of the droplets by applying a second voltage to a counter electrode positioned downstream from the charge electrode.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A photolithography system, comprising:
   a droplet generator configured to output a stream of droplets;
   a droplet receiver positioned to receive and collect the droplets;
   a laser configured to irradiate the droplets at an irradiation location between the droplet generator and the droplet receiver;
   a collector configured to receive extreme ultraviolet radiation from the droplets and to reflect the extreme ultraviolet radiation for use in photolithography;
   a charge electrode positioned between the irradiation location and the droplet receiver;
   a counter electrode positioned within the droplet receiver downstream from the charge electrode with respect to a direction of travel of the droplets;
   a droplet sensor positioned within the droplet receiver and configured to generate sensor signals indicative of a speed of the droplets within the droplet sensor; and
   a control system configured to receive the sensor signals, to apply a first voltage to the charge electrode, and to apply a second voltage to the counter electrode, the first voltage being selected to impart a net electric charge to the droplets as the droplets pass adjacent to the charge electrode, the second voltage being selected to reduce a speed of the droplets within the droplet receiver, wherein the control system is configured to adjust one or both of the first and second voltages responsive to the sensor signals.

2. The photolithography system of claim 1, wherein the first voltage and the second voltage have a same polarity.

3. The photolithography system of claim 2, wherein the second voltage has a greater magnitude than the first voltage.

4. The photolithography system of claim 1, wherein the control system includes a machine learning model that analyzes the sensor signals and outputs voltage adjustment data based on the sensor signals.

5. The photolithography system of claim 4, wherein the control system adjusts one or both of the first and second voltages based on the voltage adjustment data.

6. The photolithography system of claim 5, wherein the machine learning model includes a neural network.

7. The photolithography system of claim 5, wherein the machine learning model includes a decision tree model.

8. A method comprising:
   outputting a stream of droplets from a droplet generator;
   irradiating, with a laser, the droplets at an irradiation location between the droplet generator and a droplet receiver;
   generating a net charge in the droplets downstream from the irradiation location;
   receiving the droplets in the droplet receiver downstream from the irradiation location;

generating, with a droplet sensor positioned within the droplet receiver, sensor signals indicative of a speed of the droplets within the droplet receiver;

reducing a speed of the droplets within the droplet receiver by generating an electric field within the droplet receiver; and adjusting the electric field in response to the sensor signals.

9. The method of claim 8, wherein generating the net charge in the droplets includes applying a first voltage to a charge electrode positioned upstream from the droplet receiver.

10. The method of claim 9, wherein generating the electric field includes applying a second voltage to a counter electrode.

11. The method of claim 10, further comprising generating extreme ultraviolet radiation from the droplets by irradiating the droplets with the laser.

12. The method of claim 11, further comprising performing photolithography with the extreme ultraviolet radiation.

13. The method of claim 10, further comprising:
passing the sensor signals to a control system; and
wherein adjusting the electric field includes adjusting, with the control system, the second voltage based on the sensor signals.

14. The method of claim 13, wherein the machine learning model includes a neural network.

15. The method of claim 13, wherein the machine learning model includes a decision tree model.

16. The method of claim 13, further comprising:
passing the sensor signals, or data derived from the sensor signals to a machine learning model;
analyzing the sensor signals or the data derived from the sensor signals with the machine learning model;
generating, with the machine learning model, voltage adjustment data based, at least in part, on the sensor signals; and
adjusting one or both of the first and second voltages based on the sensor signals.

17. The method of claim 16, further comprising generating the voltage adjustment data based, at least in part, on a mass of the droplets.

18. The method of claim 16, further comprising generating the voltage adjustment data based, at least in part, on a previous speed of the droplets.

19. A method, comprising:
outputting a plurality of droplets with a droplet generator;
generating extreme ultraviolet radiation by irradiating the droplets with a laser at an irradiation location between the droplet generator and the droplet receiver;
inducing a net electric charge in the droplets by applying a first voltage to a charge electrode positioned adjacent to a path of the droplets between the irradiation location and the droplet receiver;
generating, with a droplet sensor positioned within the droplet receiver, sensor signals indicative of a speed of the droplets within the droplet receiver;
reducing a speed of the droplets by applying a second voltage to a counter electrode positioned within the droplet receiver downstream from the charge electrode;
collecting the droplets in the droplet receiver; and
adjusting the second voltage in response to the sensor signals.

20. The method of claim 19, further comprising:
passing the sensor signals to a control system; and
adjusting, with the control system, one or both of the first and second voltages based on the sensor signals.

* * * * *